(12) United States Patent
Pan et al.

(10) Patent No.: US 10,951,114 B2
(45) Date of Patent: *Mar. 16, 2021

(54) APPARATUSES AND METHODS FOR CHARGE PUMP REGULATION

(71) Applicant: Micron Technology, Inc., Boise, ID (US)

(72) Inventors: Feng Pan, Fremont, CA (US); Michele Piccardi, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/019,372

(22) Filed: Jun. 26, 2018

(65) Prior Publication Data

US 2018/0323704 A1    Nov. 8, 2018

Related U.S. Application Data

(63) Continuation of application No. 14/796,743, filed on Jul. 10, 2015, now Pat. No. 10,033,268.

(51) Int. Cl.
| | |
|---|---|
| G05F 1/10 | (2006.01) |
| G05F 3/02 | (2006.01) |
| H02M 3/07 | (2006.01) |
| G11C 5/14 | (2006.01) |

(52) U.S. Cl.
CPC ............... *H02M 3/07* (2013.01); *G11C 5/145* (2013.01)

(58) Field of Classification Search
CPC .. H02M 3/073; H02M 3/07; H02M 2003/077; G11C 5/145; G05F 3/205

USPC .......................................................... 327/536
See application file for complete search history.

(56) References Cited

U.S. PATENT DOCUMENTS

| | | | |
|---|---|---|---|
| 6,011,724 A | 1/2000 | Brigati et al. | |
| 8,373,695 B2* | 2/2013 | Kawagoshi | G09G 3/3696 345/212 |
| 9,052,730 B2 | 6/2015 | Chen et al. | |
| 9,141,119 B2 | 9/2015 | Tercariol et al. | |
| 9,385,594 B2 | 7/2016 | Van Kampen et al. | |
| 2001/0038543 A1 | 11/2001 | Buck et al. | |
| 2006/0261881 A1 | 11/2006 | Chang et al. | |
| 2009/0315598 A1 | 12/2009 | Namekawa | |
| 2012/0300552 A1* | 11/2012 | Neto | H02M 3/073 365/185.18 |
| 2013/0222051 A1* | 8/2013 | Chiu | G05F 1/10 327/536 |
| 2013/0229226 A1* | 9/2013 | Chiu | H02M 3/07 327/536 |
| 2017/0012523 A1 | 1/2017 | Pan et al. | |

* cited by examiner

*Primary Examiner* — Quan Tra
(74) *Attorney, Agent, or Firm* — Dorsey & Whitney LLP

(57) ABSTRACT

Certain embodiments of the present invention include an apparatus comprising a charge pump, configured to provide an output voltage at an output node of the charge pump, and a charge pump regulator circuit coupled to the charge pump. One such charge pump regulator circuit is configured to control the charge pump to increase the output voltage during a first period of time. Such a charge pump regulator circuit can also cause a node of a circuit coupled to the output node of the charge pump to reach a target voltage level during a second time period.

21 Claims, 7 Drawing Sheets

APPARATUSES AND METHODS FOR CHARGE PUMP REGULATION

CROSS-REFERENCE TO RELATED APPLICATION(S)

This application is a continuation of U.S. patent application Ser. No. 14/796,743, filed Jul. 10, 2015 and issued as U.S. Pat. No. 10,033,268 on Jul. 24, 2018. The aforementioned application, and issued patent, are incorporated by reference herein, in their entirety, and for any purposes.

BACKGROUND

A charge pump generally includes capacitors and/or other electrical components to create either a higher or lower voltage power source. Charge pumps are typical in many different types of electronics and are often used as high voltage power supplies. A charge pump can be characterized in terms of its output impedance. The smaller the output impedance of the pump, the closer it will behave as an ideal power supply (an ideal power supply has zero output impedance). For example, during the programming stage of non-volatile memories, charge pumps are often used to provide a programming voltage to a memory cell of the memory. Typical charge pumps also include a charge pump regulation loop that controls the output voltage of the charge pump. For example, the charge pump "on-off" regulation loop might detect when the output voltage of the charge pump has reached a target voltage level and deactivate the charge pump until the regulation loop determines that the output voltage of the charge pump falls below the target voltage level. Once the charge pump has reached the target voltage level for a given charge cycle, the charge pump regulation loop might activate and deactivate the charge pump as necessary to maintain the output voltage of the charge pump around the target voltage level. In this condition, the amount of charge available to the load per unit of time is reduced, thus the output impedance of the charge pump increases and its performance is reduced. Traditional regulation loops only account for the output voltage of the charge pump, without accounting for whether or not the circuit elements receiving charge from the pump are provided with sufficient voltage.

DETAILED DESCRIPTION

Figure 1:
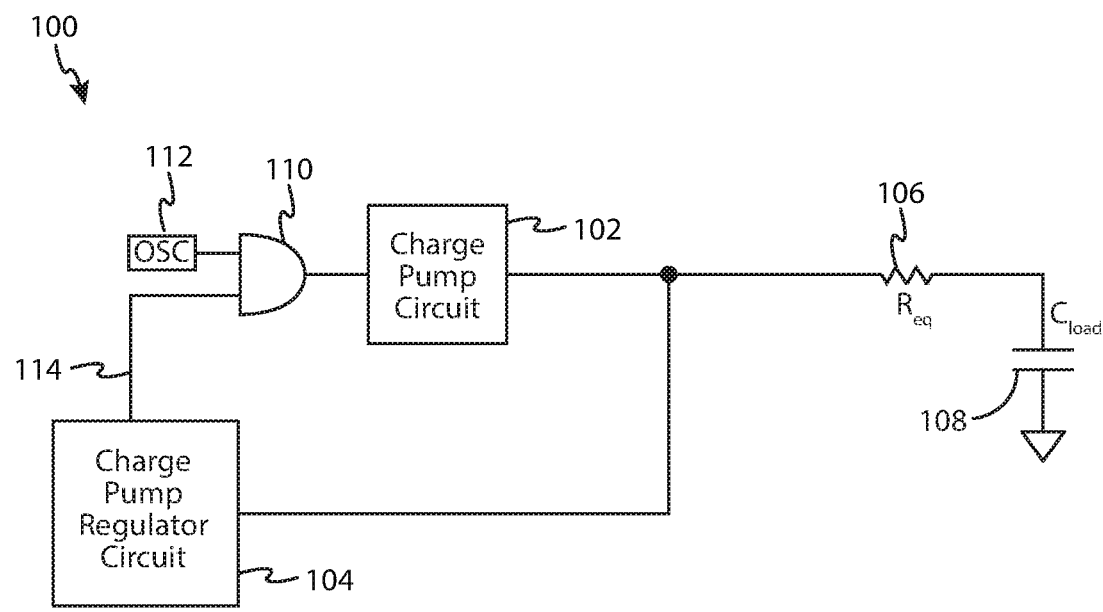
FIG. 1 is a functional block diagram depicting an apparatus including a charge pump regulator circuit, in accordance with an embodiment of the present invention.

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the disclosure.

In highly integrated circuits, such as integrated circuit memory (e.g., three-dimensional (3D) NAND memory), the integrated circuitry may result in physical limitations that adversely affect the performance of the circuit. One of the possible physical limitations is layout bottlenecks, which result from a limited space within the apparatus to realize connections between components. Layout bottlenecks act like resistors positioned between components. As a result of this behavior, a voltage drop occurs between connected components. In the case of 3D NAND memory, a bottlenecking resistance can occur between a charge pump and a word line being programmed by the charge pump. The consequence of this layout and the bottlenecking resistance is that traditional charge pump regulators will determine that the output voltage of the charge pump reaches the target voltage level before the word line reaches the target voltage level. When the output voltage of the charge pump reaches the target voltage level, a regulator circuit may deactivate the charge pump, increasing the output impedance of the pump and reducing the rate at which charge is delivered to the word line (thus slowing the programming process).

For example, if a word line has a target programming voltage level of 26V, when the output voltage of the charge pump reaches the target level of 26V, the word line may not yet have reached the target voltage level, such as due to a voltage drop between the charge pump and the word line due to the bottlenecking resistance. The practical effect is that the voltage supplied to the word line is less than the voltage provided by the charge pump. As mentioned above, the typical charge pump regulator detects the output voltage level of the charge pump but not the voltage level of the word line and deactivates the charge pump once the target voltage level is detected. The charge pump effectively slows down the rate at which voltage is provided to the word line and as a result the rate at which the word line is charging slows. This effect limits the overall speed of the 3D NAND memory by reducing the speed at which word lines may be programmed. Disclosed herein are various charge pump regulator circuits which may, for example, improve the charging time for the word lines.

Exemplary embodiments of the present invention will now be discussed with reference to the several drawings.

FIG. 1 illustrates an apparatus 100 (e.g., an integrated circuit, a memory device, a memory system, an electronic device or system, a smart phone, a tablet, a computer, a server, etc.) according to an embodiment of the disclosure. Apparatus 100 may generally include a charge pump 102, a charge pump regulator circuit 104, an effective resistance 106, a circuit 108, an AND gate 110, and an oscillator input 112.

Charge pump 102 can include an electrical circuit that receives an input signal and outputs a signal at an output node having a higher absolute output voltage (e.g., more positive or more negative) than that of the input signal. Charge pump 102 may be any circuit element or combination of circuit elements capable of receiving an input voltage and outputting a higher absolute output voltage. Charge pump 102 may include, for example, capacitors, transistors, and/or any other appropriate circuit components. In various embodiments, the charge pump 102 may be used to provide one or more circuits 108 with a voltage at a particular target voltage level. The output node of charge pump 102 is generally coupled to one or more circuits 108 and a charge pump regulator circuit 104. Operation of the charge pump 102 is described in further detail below with respect to FIG. 6.

Charge pump regulator circuit 104 can include an electrical circuit coupled to the output node of charge pump 102. A charge pump regulator circuit 104 may include one or more circuit components configured to provide a regulator circuit output signal 114 to selectively activate or deactivate the charge pump 102. Charge pump regulator circuit 104 may control the charge pump 102 to be deactivated after the charge pump 102 has provided sufficient charge to the circuits 108 to which the charge pump 102 is coupled. Charge pump regulator circuit 104 may include a comparator (see FIGS. 2-4), the inputs and/or output of which may be configured to ensure that charge pump 102 remains active until sufficient time has passed for the circuits 108 to reach the target voltage level.

A circuit 108 can include circuit components, elements, and or devices that receive charge from charge pump 102 in order to reach a target voltage level at a particular node of the circuit 108. For simplicity, the circuits 108 may be modeled as capacitors that receive charge during the time period that the charge pump 102 is active. However, those skilled in the art will appreciate that the circuits 108 may be any circuit component or combination of components that can be charged over time. For example, in non-volatile memories, the circuits may represent for example, word lines, word line drivers, or decoder circuits of the memory that charge as part of the programming function of the memory. In such embodiments, the circuits 108 may have a target voltage level, $V_{pgm}$, to which a node of the circuits should be charged in order to satisfactorily complete the programming function.

As discussed above, one physical limitation of tightly integrated circuits, such as 3D NAND memories, is an unavoidable impedance, or effective resistance, that results from layout bottlenecks in the device layout. This physical constraint may be modeled as an effective resistance 106 in the embodiment of FIG. 1. Those skilled in the art will appreciate that effective resistance 106 may not be a separate resistance circuit, but rather an artifact of physical limitations of conductive signal lines when charge is provided through the tightly integrated apparatus 100. Effective resistance 106 may result in a voltage drop, which may cause the level of voltage at a node of the circuit 108 to be less than the level of the voltage being provided at an output node of the charge pump 102.

To control the output of the charge pump 102, a charge pump regulator circuit 104 may be coupled to the output node of the charge pump 102. Charge pump regulator circuit 104 may be coupled to an AND gate 110, which also receives, as an input, a signal from an oscillator 112. The oscillator 112 can provide a periodic signal used for the charging operation of the charge pump 102. For example, in a 3D NAND memory, the oscillator may provide a periodic signal during the program operation of the circuits 108. The AND gate 110 may provide a periodic signal (e.g., based on the periodic signal from the oscillator) or a signal having a constant level (e.g., a logically low signal) based on the regulator circuit output signal 114. For example, when the regulator circuit output signal 114 is a logically low signal, the AND gate 110 provides a logically low signal to the charge pump 102, regardless of the state of the signal provided by the oscillator 112. As a result, the charge pump 102 does not operate to provide a pumped output voltage. In contrast, when the regulator circuit output signal 114 is a logically high signal, the AND gate 110 provides as an output the periodic signal provided to it by the oscillator 112. As a result, the charge pump 102 operates to provide a pumped output voltage. Thus, the charge pump regulator circuit 104 can effectively activate or deactivate the charge pump 102 for operation. In an example embodiment, an AND gate is a simple implementation for "on-off" regulation scheme, although other gates can be used as well.

Figure 2:
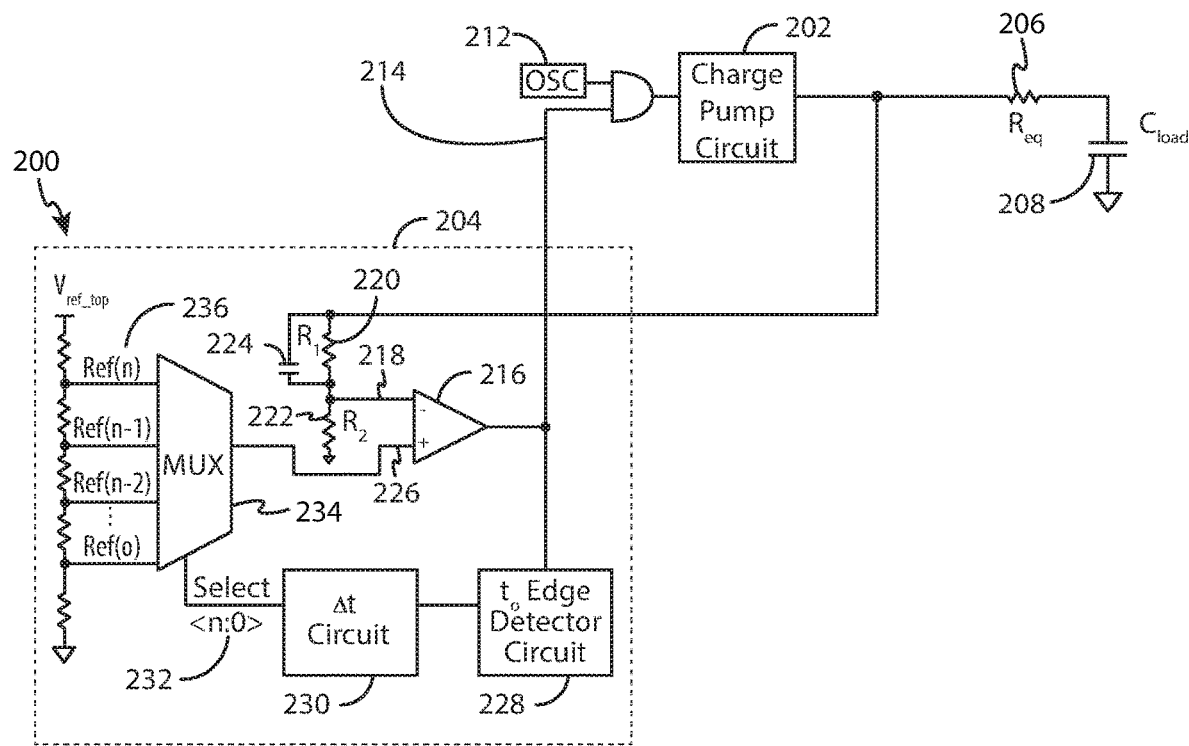
FIG. 2 is a schematic diagram depicting an apparatus including a charge pump regulator circuit, in accordance with an embodiment of the present invention.

FIG. 2 is a schematic diagram depicting an apparatus, generally designated 200, in accordance with an embodiment of the present invention. Apparatus 200 generally includes a charge pump 202, a charge pump regulator circuit 204, an effective resistance 206, a circuit 208, an AND gate 210, an oscillator 212, and a regulator output signal 214. In the embodiment of FIG. 2, charge pump 202, charge pump regulator circuit 204, effective resistance 206, circuit 208, AND gate 210, oscillator 212, and regulator output signal 214 may each be implemented as charge pump 102, charge pump regulator circuit 104, effective resistance 106, circuit 108, AND gate 110, oscillator 112, and regulator output signal 114, respectively, as described above with respect to FIG. 1.

Charge pump regulator circuit 204 may include a comparator 216. Comparator 216 may be any type of comparator capable of receiving two input signals, and outputting a signal based on which of the two input signals has a greater voltage, such as an operational amplifier. In the embodiment of FIG. 2, comparator 216 provides the regulator output signal 214 to the AND gate 210. Comparator 216 may receive two input signals, feedback signal 218 and reference signal 226. Each of feedback signal 218 and reference signal 226 may have an associated voltage level. The voltage level of the reference signal 226 may be related to the target output voltage level for the charge pump 202. For example, the voltage level of the reference signal may be equal to the target output voltage level, or in some embodiments, scaled to be less than the target output voltage level.

As shown in FIG. 2, if the voltage level of feedback signal 218 is less than the voltage level of reference signal 226, then comparator 216 outputs a high regulator output signal 214 to AND gate 210. As a result, as previously discussed, the control logic 210 provides a periodic signal to the charge pump 202 that is based on the periodic signal provided by the oscillator 212 so that the charge pump 202 operates to provide a pumped output voltage. If the voltage level associated with feedback signal 218 is not less than the voltage level of reference signal 226, then comparator 216 provides a low regulator output signal 214 to AND gate 210, which deactivates charge pump 202. Those skilled in the art will appreciate that the embodiment of charge pump regulator circuit 204, as described below may include greater, fewer, or different components than those described without departing from the scope of this disclosure.

Feedback signal 218 may be provided by a parallel RC circuit, including a resistor 220 and a capacitor 224, coupled to a second resistor 222, as shown in FIG. 2. In various embodiments, the resistors 220 and 222 may be fixed resistors, variable resistors, or a combination thereof. The output node of charge pump 202 may also be coupled to the parallel RC circuit. In the embodiment of FIG. 2, the voltage level associated with feedback signal 218 may be a fraction of the output voltage level of charge pump 202, where the fraction is determined by the relative resistances of the resistors 220 and 222. For example, if resistor 220 has a resistance $R_1$ and resistor 222 has a resistance $R_2$, then the voltage level of feedback signal 218 equals the level of the voltage output by charge pump 202 reduced by a factor of $R_2/(R_1+R_2)$. In operation, as the output voltage level of the charge pump 202 increases, so does the voltage level of feedback signal 218.

Reference signal 226 may be configurable to change the reference voltage against which feedback voltage 218 may be compared by comparator 216. In the embodiment of FIG. 2, reference signal 226 may have a voltage level that is related to (e.g., scaled down from the actual voltage) the target voltage levels of charge pump 202 and circuits 208 (e.g., 26V). For example, the voltage level of the reference signal 226 may be reduced by the factor of the parallel RC circuit. However, as noted above, the voltage level at a node of the circuit 208 may be less than the level of the voltage on the output node of the charge pump 202 because of, for example, a voltage drop across effective resistance 206. Therefore, while the output voltage of the charge pump 202 reaches the target voltage level, the target nodes of circuits 208 may have not yet reached the target voltage level. To account for this voltage difference, charge pump regulator circuit 204 may detect the occurrence of $t_0$, and raise the voltage level of reference signal 226 for a time period, Δt, so that the voltage level of reference signal 226 remains higher for that time period. Raising the voltage level of the reference signal 226 effectively raises the target voltage level for the charge pump 202. As a result, charge pump 202 remains active until the level of the output voltage of the charge pump 202 reaches the increased target voltage level. By keeping charge pump 202 active after it reaches the initial target voltage level, the time required for the target nodes of circuits 208 to reach the desired target voltage level may be reduced, which can result in an overall increase in speed for a memory (e.g., 3D NAND memory).

To effect the transition of the voltage associated with reference signal 226, charge pump regulator circuit 204 may include a $t_0$ edge detector circuit 228, a Δt circuit 230, a multiplexer circuit 234, and a number of reference voltages 236. The $t_0$ edge detection circuit 228 may be coupled to regulator output signal 214 and detect when the value of the regulator output signal changes, which represents the point in time at which the output node of charge pump 202 reaches the initial target voltage level (i.e., $t_0$). In one embodiment, $t_0$ edge detector circuit 228 may be implemented using a simple latch circuit, such as a D flip-flop.

The Δt circuit 230 determines, either statically or dynamically, the amount of time, Δt, that charge pump 202 should remain active for the target nodes of circuits 208 to reach the desired target voltage level. Δt may be a time period based on known quantities of charge pump 202 output, effective resistance 206, and circuits 208. Accordingly, Δt may be embodied in preprogrammed logic, as will be appreciated by one skilled in the art. In this embodiment, Δt is statically determined based on known quantities. In other embodiments, Δt may be dynamically determined. Dynamic determination of Δt may be implemented based on the rate at which the circuits 208 charge prior to the time $t_0$, such as by measuring the rate of voltage increase at target nodes of circuits 208 prior to $t_0$ and calculating the additional time necessary, Δt, for the target nodes of circuits 208 to reach the target voltage level.

Multiplexer 234 may include any circuit component or combination of circuit components capable of receiving multiple input signals and a selector signal and providing an output signal based on the input signals and the selector signal. Reference voltages 236 may be a set of signals, each of which has a different associated voltage level. In various embodiments, reference voltages 236 may be provided by a voltage divider circuit, as shown in FIG. 2. Reference voltages 236 may provide the input signals to multiplexer 234, and the output signal 232 of Δt circuit 230 may provide the selector signal to multiplexer 234 to select which of the reference voltages 236 to be provided as the reference voltage 226, as shown in FIG. 2.

In operation, the apparatus 200 operates to increase the output voltage from the beginning of the charge cycle until $t_0$. At $t_0$, the $t_0$ edge detection circuit 228 detects the transition of the regulator output signal 214 provided by comparator 216. Upon detection of $t_0$, the $t_0$ edge detection circuit 228 provides a triggering signal to Δt circuit 230. The Δt circuit 230 determines, either statically or dynamically, the required Δt for which the charge pump should remain active and a new voltage that should be associated with reference signal 226, as described above. The Δt circuit 230 may provide output signal 232 to multiplexer 234 as a multibit selector signal, which designates a particular reference voltage signal 236 to output. Multiplexer 234 may provide the designated reference voltage 236 to comparator 216 as reference signal 226. In various embodiments, after the time period Δt expires, the Δt circuit 230 may provide a second output signal 232 to multiplexer 234 which designates that multiplexer 234 should reduce the voltage level of reference signal 226 provided to comparator 216. By dynamically raising the voltage level of reference signal 226, charge pump regulator circuit 204 may ensure that charge pump 202 continues to provide (e.g., supply) charge to circuits 208 for a sufficient amount of time to ensure that target nodes of circuits 208 reach the target voltage level.

Figure 3:
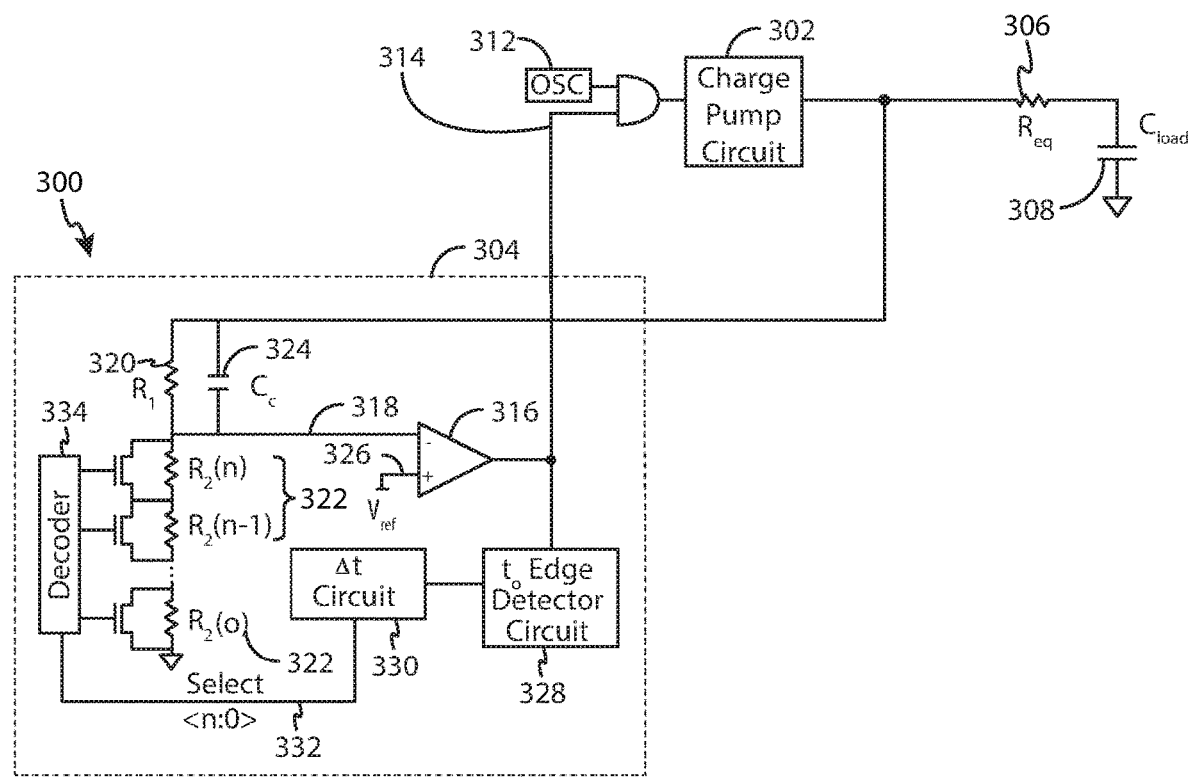
FIG. 3 is a schematic diagram depicting an apparatus including a charge pump regulator circuit, in accordance with an embodiment of the present invention.

FIG. 3 is a schematic diagram depicting an apparatus, generally designated 300, in accordance with an embodiment of the present invention. Apparatus 300 generally includes a charge pump 302, a charge pump regulation circuit 304, an effective resistance 306, one or more circuits 308, an AND gate 310, and an oscillator 312. Charge pump 302, charge pump regulator circuit 304, effective resistance 306, circuits 308, AND gate 310, and oscillator 312 may each be implemented as charge pump 102, charge pump regulator circuit 104, effective resistance 106, circuits 108, AND gate 110, and oscillator 112, as described above with respect to FIG. 1.

Charge pump regulator circuit 304 may include a comparator 316, which receives as inputs a reference signal 326, and a feedback signal 318, and outputs a regulator output signal 314 based on the relative voltages of the input signals. In the embodiment of FIG. 3, the reference signal 326 may carry a fixed voltage. Feedback signal 318 may carry a configurable voltage, which may be manipulated during a charge cycle, as described in further detail below. Those skilled in the art will appreciate that the embodiment of charge pump regulator circuit 304, as described below may include greater, fewer, or different components than those described without departing from the scope of this disclosure.

Feedback signal 318 may be provided by a parallel RC circuit coupled in series to a variable voltage divider. Feedback signal 318 may be related to the output voltage level of the charge pump 302, for example, the voltage level of feedback signal 318 may be equal to the output voltage level of the charge pump 302 or configurably scaled to be less than the output voltage level of the charge pump 302. The parallel RC circuit may include a resistor 320, having a fixed resistance, $R_1$, and a capacitor 324, having a fixed capacitance, $C_c$. The parallel RC circuit may be coupled in series with a plurality of resistors 322. The resistors 322 may be selectively included or excluded (by shorting the circuit around them) from feedback signal 318 by a decoder 334 to change the voltage level of feedback signal 318. The output voltage signal of pump 302 may be scaled by the parallel RC circuit and the resistors 322 to provide feedback signal 318. By selectively including or excluding resistors 322, the factor by which the output voltage level of charge pump 302 is scaled may be changed, which results in a different voltage level provided by feedback voltage 318.

Charge pump regulator circuit 304 may further include a $t_0$ edge detector circuit 328 coupled to regulator output signal 314 and coupled to a $\Delta t$ circuit 330, which is coupled to the decoder 334. The $t_0$ edge detection circuit may be any combination of electronic components capable of detecting a change in the output signal of the regulator output signal 314, and outputting a signal in response to detecting the change. In one embodiment, $t_0$ edge detector circuit 328 may be implemented using a simple latch circuit, such as a D flip-flop.

The $\Delta t$ circuit 330 may be any combination of electronic components whose output reflects a particular period of time, $\Delta t$, between when the output node of the charge pump 302 reaches the target voltage level and when the target nodes of circuits 308 reach the target voltage level if the charge pump 302 remains active. The $\Delta t$ circuit 330 may determine the time period either statically or dynamically, as described above with respect to FIG. 2. In the embodiment of FIG. 3, $\Delta t$ circuit 330 may determine a new scaling factor by which the output voltage level of charge pump 302 may be reduced so that the voltage level of feedback signal 318 is less than the voltage level of reference signal 326 until the voltage level of the target nodes of circuits 308 reaches the target voltage level. Based on the new scaling factor, $\Delta t$ circuit 330 may provide a multibit selector signal 332 to decoder 334. Decoder 334 may be any combination of electronic components capable of selectively activating one or more output signals responsive to a received input signal (i.e., selector signal 334).

In operation, the embodiment of FIG. 3 provides a mechanism for selectively changing (e.g., altering, adjusting, modifying or the like) the voltage of feedback signal 318 responsive to the output node of charge pump 302 reaching the target voltage level in order to ensure that the charge pump 302 remains active for a time, $\Delta t$, during which the target nodes of circuits 308 continue to charge to the target voltage level. Initially, the charge pump 302 begins charging the circuits 308 and the voltage level of feedback signal 318 is less than the voltage level of reference signal 326. As the output voltage level of the charge pump 302 increases, so does the voltage level of feedback signal 318. When the output voltage level of the charge pump 302 reaches the target voltage level, the voltage level of feedback signal 318 becomes greater than the voltage level of reference signal 326. In response, the comparator 316 changes the logical value of the regulator output signal 314. The to detector circuit 328 detects the change in the logical value of regulator output signal 314, and transmits a signal to $\Delta t$ circuit 330. The $\Delta t$ circuit 330 determines a new scaling factor which may be applied to the output voltage level of charge pump 302 to reduce the voltage level of feedback signal 318 for the statically or dynamically determined time period, $\Delta t$. The $\Delta t$ circuit 330 provides a multibit selector signal 332 to decoder 334, which initiates a change in the output signals of decoder 334 to selectively remove some of the resistors 322 from the circuit by shorting around the resistors 322. By shorting the circuit around some of the resistors 322, the total resistance of the variable voltage divider may be reduced, which also reduces the scaling factor applied to the output voltage level of the charge pump 302 and reduces the voltage level of feedback signal 318. The reduced voltage level of feedback signal 318 may be less than the voltage level of reference signal 326, which triggers the comparator 316 to change the logical value of regulator output signal 314 and reactivate the charge pump 302. Decreasing the voltage level of feedback signal 318 effectively raises the target voltage level for the charge pump 302. Once the time period $\Delta t$, has passed, the $\Delta t$ circuit 330 may transmit a new multibit selector signal 332 to the decoder 334, which resets the scaling factor to its original value and increases the voltage level of feedback signal 318 to a value greater than the voltage level of reference signal 326, triggering a change in the logical value of regulator output signal 314 and deactivating the charge pump 302.

Figure 4:
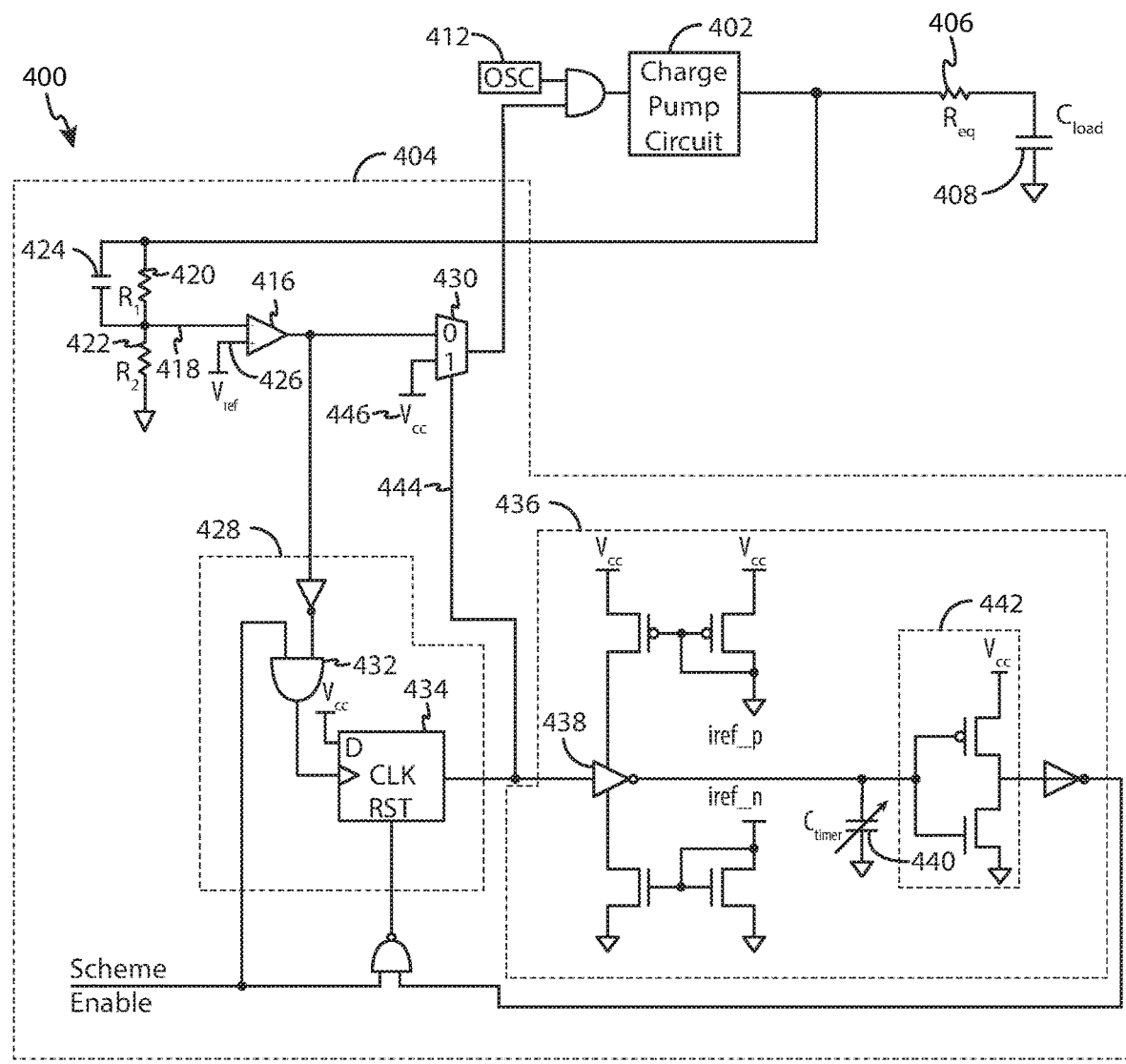
FIG. 4 is a schematic diagram depicting an apparatus including a charge pump regulator circuit, in accordance with an embodiment of the present invention.

FIG. 4 is a schematic diagram depicting an apparatus, generally designated 400, in accordance with an embodiment of the present invention. The embodiment of FIG. 4 generally includes a charge pump 402, a charge pump regulator circuit 404, an effective resistance 406, one or more circuits 408, an AND gate 410, and an oscillator 412. In various embodiments, charge pump 402, charge pump regulator circuit 404, effective resistance 406, circuits 408, AND gate 410, and oscillator 412 may each be implemented as charge pump 102, charge pump regulator circuit 104, effective resistance 106, circuits 108, AND gate 110, and oscillator 112, respectively, as described above with respect to FIG. 1.

Charge pump regulator circuit 404 generally includes a comparator 416, resistors 420 and 422, capacitor 424, reference signal 426, $t_0$ edge detector circuit 428, analog timer 436, and multiplexer 430. Resistor 420 and capacitor 424 may be coupled in parallel to form a parallel RC circuit. Charge pump 402 may be coupled to the parallel RC circuit which may be coupled to resistor 422, and comparator 416. The voltage level of the output node of charge pump 402 may be reduced by a scaling factor, which depends on the relative resistances of resistors 420 and 422 and the capacitance of capacitor 424 as described above with respect to FIG. 2. The parallel RC circuit and resistor 422 provide feedback signal 418 to comparator 416, which has a voltage level related to the voltage level of the output node of the charge pump 402 (e.g., reduced by the scaling factor). Comparator 416 may receive, as a second input signal, reference signal 426, which may have a constant voltage level associated with it (e.g., equal to a target voltage level of the charge pump 402 and circuits 408). The output signal of the comparator 416 may be coupled to the multiplexer 430 and the $t_0$ edge detector circuit 428. Those skilled in the art will appreciate that the embodiment of charge pump regulator circuit 404, as described below may include greater, fewer, or different components than those described without departing from the scope of this disclosure.

The $t_0$ edge detector circuit 428 may be any combination of components capable of detecting a change in the logical value of the output of the comparator 416. The $t_0$ edge detector circuit may include an AND gate 432 and a D flip-flop 434, as shown in FIG. 4. In various embodiments, the output of the comparator may be coupled, either directly or indirectly, to the AND gate 432. The output of AND gate 432 may be coupled to the clock input of the D flip-flop 432. The D flip-flop 432 may receive as a data input, a constant voltage signal, such as $V_{cc}$. The output of the D flip-flop 432 may be the output of the $t_0$ edge detector circuit, and may be coupled to the multiplexer 430 as a selector signal and coupled to the analog timer circuit 436.

The analog timer circuit 436 may include any combination of electronic components capable of charging for a particular (e.g., predetermined) period of time, and outputting a signal responsive to the particular time period elapsing. In the embodiment of FIG. 4, analog timer circuit 436 generally includes a current starved inverter 438, a capacitor 440, and an inverter 442 having an associated threshold voltage. The current starved inverter 438 may be any combination of electronic components for which the propagation delay of the inverter is configurable. The capacitor 440 may be a fixed or trimmable capacitor, and may be used to configure the propagation delay of the current starved inverter 438. In the embodiment of FIG. 4, the capacitor 440 has a capacitance, $C_{timer}$. The inverter 442 may be any type of inverter having a known threshold voltage, $V_{trip}$. In the embodiment of FIG. 4, the current starved inverter receives, as an input, the output of $t_0$ edge detector circuit 428. The current starved inverter 438 is coupled to the capacitor 440 and the inverter 442. The output of the inverter 442 may be coupled to the reset of D flip-flop 434.

In operation, charge pump 402 increases the output voltage level at the circuit 408 and the parallel RC circuit which, in combination with resistor 422, provides feedback signal 418 to comparator 416. As the output voltage level of the charge pump 402 increases, so does the voltage level associated with feedback signal 418. During the initial portion of the charging cycle, when the voltage level of the reference signal 426 is greater than the voltage level of the feedback signal 418, the output of the comparator may be logically high, and the output of the $t_0$ edge detector circuit may be logically low, which will allow the output of the comparator to pass through the multiplexer 430 to regulator output signal 414. When voltage at the output node of the charge pump 402 reaches the target voltage level at $t_0$, the voltage level of feedback signal 418 will surpass the voltage level of reference signal 426, triggering a change in the logical value of the output signal of the comparator 416. When the output of comparator 416 changes, the output signal of the AND gate 432 may change its logical value.

As described above, AND gate 432 may be coupled to the clock input of the D flip-flop 434. Accordingly, when the output of the AND gate 432 changes, the output of D flip-flop 434 changes to reflect the constant voltage applied to the data input of the D flip-flop 434. When the output of the D flip-flop 434 changes, the selector signal 444 may change the regulator output signal 414 of the multiplexer 430 to be logically high based on a constant input signal 446. The logically high output of the D flip-flop 434 triggered by the transition of the comparator output may also be provided to the analog timer circuit 436 as described above. The output of the D flip-flop 434 may pass through the current starved inverter 438 and begin to charge the capacitor 440. During the particular time, Δt, charge may build up on the capacitor 440 until the voltage reaches the threshold voltage, $V_{trip}$ of the inverter 442. Once the threshold voltage is reached (i.e., after the time period, Δt, has elapsed), the output of the inverter 442 may change and provide a signal to the reset input of the D flip-flop 434. Once the D flip-flop is reset, the selector signal 444 may reset to a logically low value, which triggers the multiplexer 430 to allow the output of the comparator to pass to regulator output signal 414.

The effect of charge pump regulator circuit 404 is to allow the charge pump 402 to charge until the voltage on an output node of the charge pump 402 reaches the target voltage level, and then to delay the output of the comparator by a particular time period, Δt, using an analog timer circuit. During the timer period, Δt, the charge pump 402 may continue to provide charge to the circuits 408 until the voltage at target nodes of the circuits 408 reaches the target voltage level.

Figure 5A:
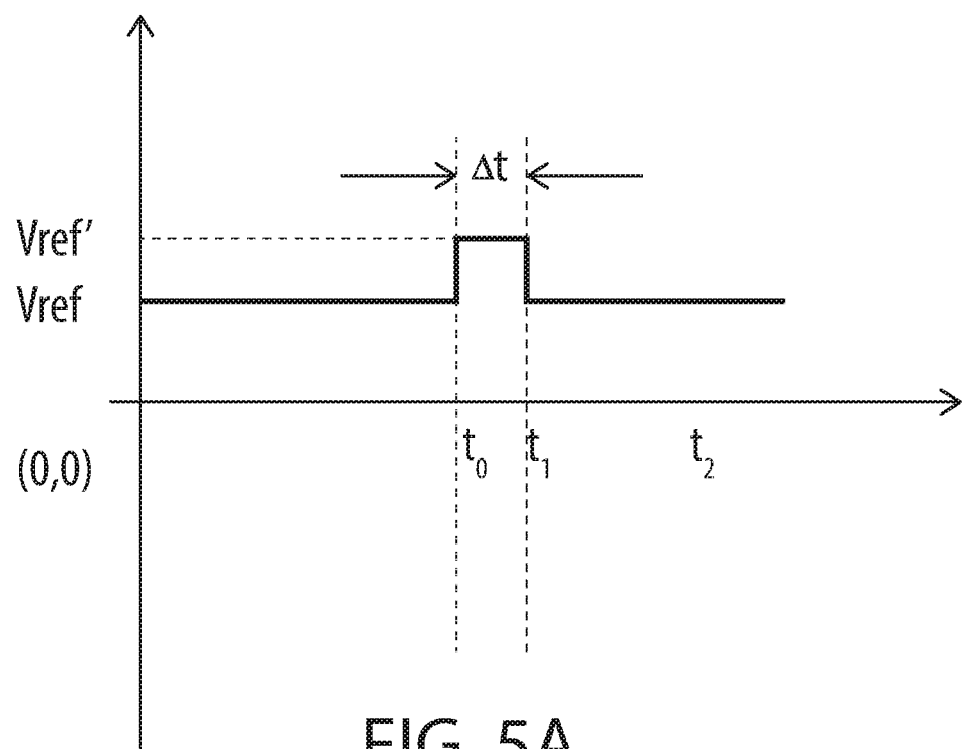
FIGS. 5A-C depict timing diagrams for an apparatus in accordance with the embodiment of FIG. 2.
Figure 5B:
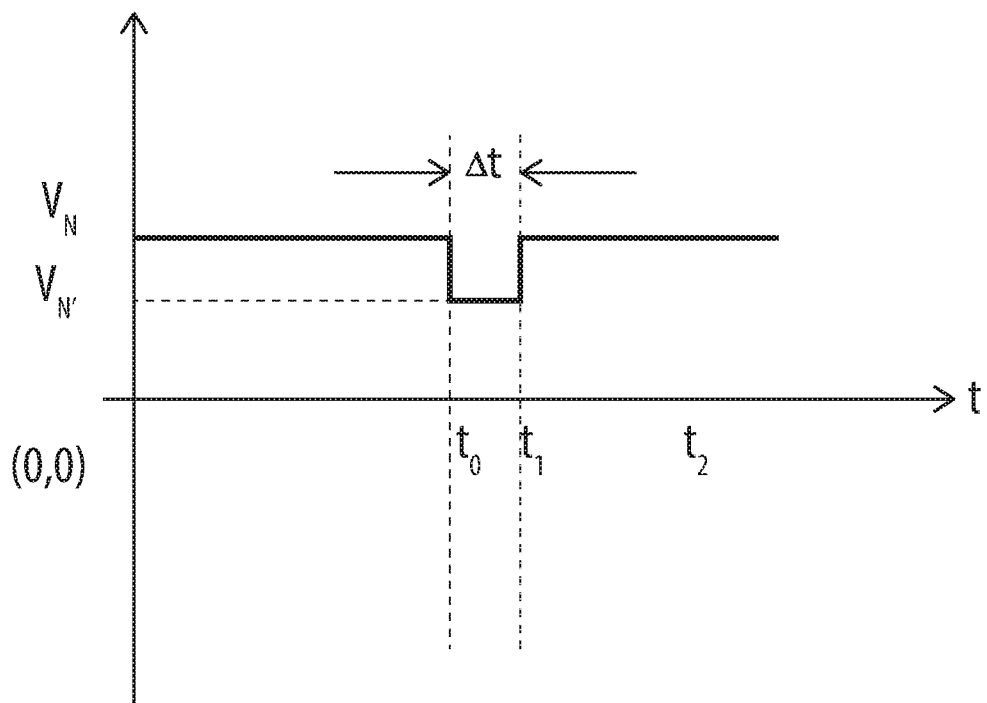
Figure 5C:
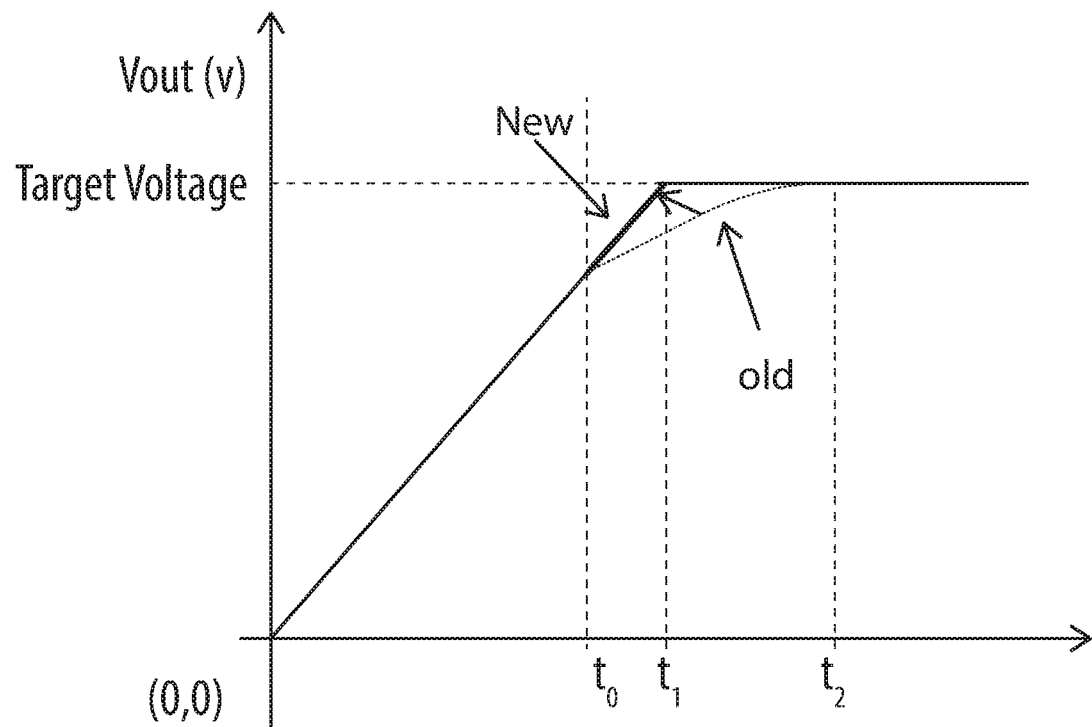

FIGS. 5A-C depict timing diagrams for an apparatus in accordance with the embodiment of FIG. 2. FIG. 5A depicts the value of reference signal 226 during a charge cycle. From the beginning of the charge cycle until $t_0$, reference signal 226 has a first voltage level, $V_{ref}$. At time $t_0$, the voltage of the reference signal 226 increases to a second voltage level, $V_{ref'}$. Reference signal 226 maintains the second voltage level for a time period, Δt, and then decreases to the first voltage level. FIG. 5B depicts the value of feedback signal 318 during a charge cycle. From the beginning of the charge cycle until $t_0$, feedback signal 318 has a first voltage level, $V_N$. At time $t_0$, the voltage of the feedback signal 318 decreases to a second voltage level, $V_{N'}$. Feedback signal 318 maintains the second voltage level for a time period, Δt, and then increases back to the first voltage level. FIG. 5C depicts the voltage at a target node of the circuit 208 during the same time period as FIG. 5A or 5B. From the beginning of the charge cycle to a time, $t_0$, the voltage supplied to the circuits 208 increases approximately linearly. Without the charge pump regulator circuit 204, at $t_0$ the rate at which voltage is supplied to circuits 208 would decrease as the charge pump 202 begins to activate and deactivate. With the charge pump regulator circuit 204, at $t_0$ the increase in the voltage level of reference signal 226 controls the charge pump 202 to remain active and results in the target nodes of circuits 208 being charged to the target voltage level more quickly than if the voltage level of the reference signal 226 remained constant.

Figure 6:
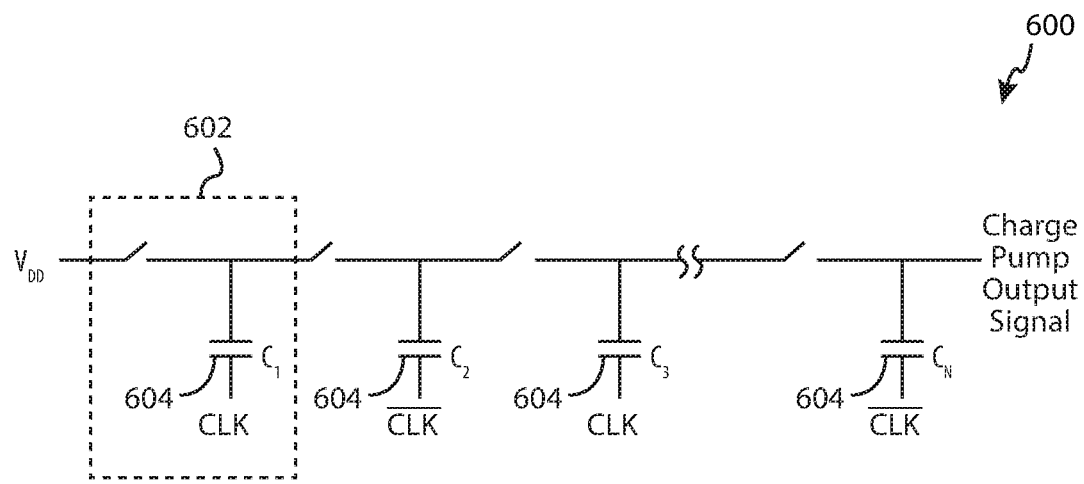
FIG. 6 depicts a charge pump, in accordance with an embodiment of the present invention.

FIG. 6 depicts a charge pump, generally designated 600, in accordance with an embodiment of the present invention. Charge pump 600 may be implemented as charge pump 102, 202, 302, and/or 402 as described above. Charge pump 600 may include a plurality of charge pump stages 602 coupled in series. Each charge pump stage may include a capacitor 604 having an associated capacitance (e.g., $C_1$, $C_2$, etc.) coupled to a clock signal. Capacitors 604 in alternating charge pump stages 602 may receive non-overlapping clock signals. The charge pump may receive as an input a voltage $V_{DD}$ and provide a charge pump output signal to a charge pump regulator circuit (e.g., charge pump regulator circuit 104) and a circuit (e.g., circuit 108) as described above with respect to FIGS. 1-4. The circuits may represent, for example, word lines, word line drivers or decoder circuits of the memory that charge as part of the programming function of the memory.

Figure 7:
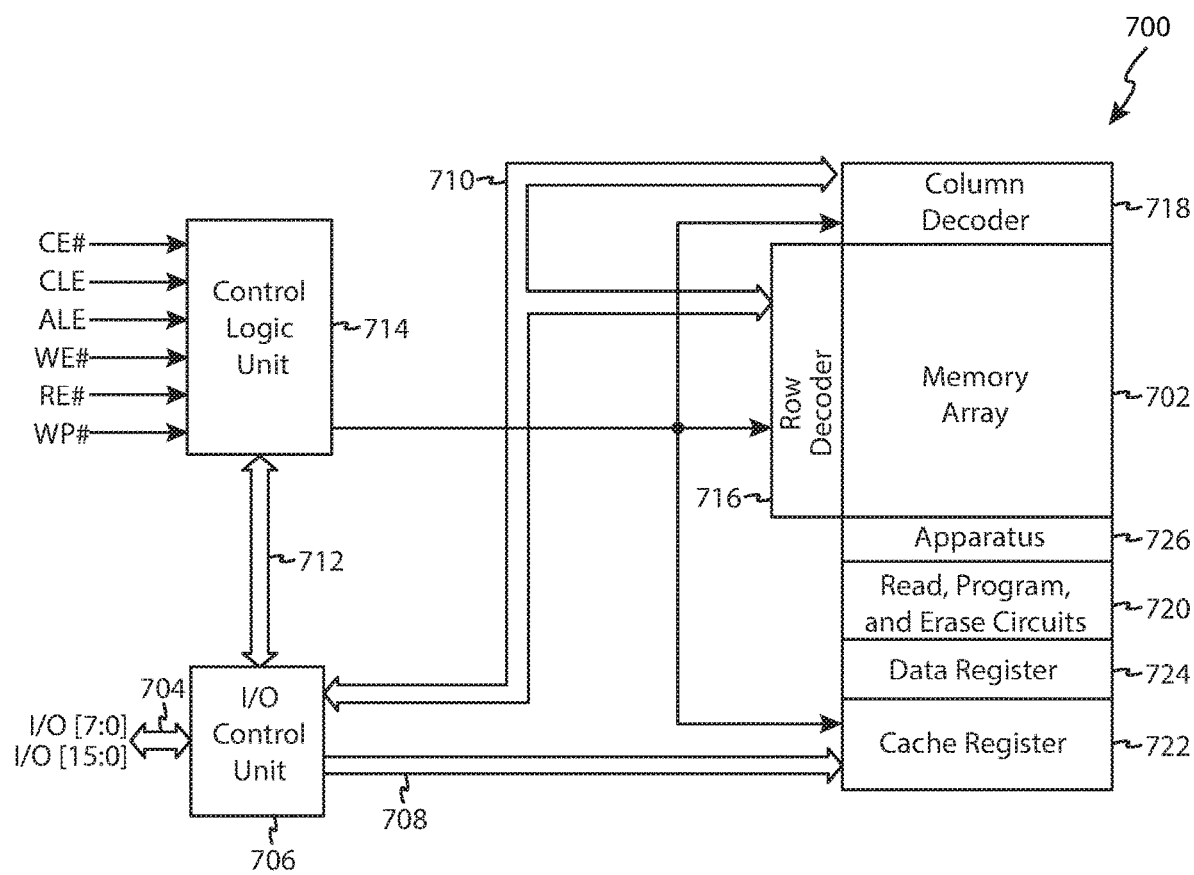
FIG. 7 illustrates a portion of a memory, in accordance with an embodiment of the present invention.

FIG. 7 illustrates a portion of a memory 700 according to an embodiment of the present invention. The memory 700 includes an array 702 of memory cells. The memory cells may be non-volatile memory cells, but may also be volatile memory cells (e.g., DRAM, SDRAM), or any other type of memory cells. Command signals, address signals and write data signals are applied to the memory 700 as sets of sequential input/output ("I/O") signals transmitted through an I/O bus 704. Similarly, read data signals are output from the memory 700 through the I/O bus 704. The I/O bus 704 is connected to an I/O control unit 706 that routes the signals between the I/O bus 704 and an internal data bus 708, an internal address bus 710, and an internal command bus 712. The memory 700 also includes a control logic unit 714 that receives a number of control signals either externally or through the command bus 712 to control the operation of the memory 700.

The address bus 710 applies block-row address signals to a row decoder 716 and column address signals to a column decoder 718. The row decoder 716 and column decoder 718 may be used to select blocks of memory or memory cells for memory operations, for example, read, program, and erase operations. The column decoder 718 enables write data signals to be applied to columns of memory corresponding to the column address signals and allow read data signals to be coupled from columns corresponding to the column address signals.

In response to the memory commands decoded by the control logic unit 714, the memory cells in the array 702 are read, programmed, or erased. Read, program, and erase circuits 720 coupled to the memory array 702 receive control signals from the control logic unit 714 and include voltage generators for generating various pumped voltages for read, program and erase operations.

After the row address signals have been applied to the address bus 710, the I/O control unit 706 routes write data signals to a cache register 722. The write data signals are stored in the cache register 722 in successive sets each having a size corresponding to the width of the I/O bus 704. The cache register 722 sequentially stores the sets of write data signals for an entire row or page of memory cells in the array 702. All of the stored write data signals are then used to program a row or page of memory cells in the array 702 selected by the block-row address coupled through the address bus 710. In a similar manner, during a read operation, data signals from a row or block of memory cells selected by the block-row address coupled through the address bus 710 are stored in a data register 724. Sets of data signals corresponding in size to the width of the I/O bus 704 are then sequentially transferred through the I/O control unit 706 from the data register 724 to the I/O bus 704.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as previously described.

What is claimed is:

1. An apparatus comprising:
   a charge pump configured to provide an output voltage at an output node of the charge pump; and
   charge pump regulator circuit coupled to the charge pump, the charge pump regulator circuit configured to output a regulator output signal based at least on a reference voltage, detect a change in the regulator output signal indicating the output node of the charge pump reaches the reference voltage while in a charging operation, and subsequent to detecting the change in the regulator output signal, cause the charge pump to continue charging during a time period by changing the reference voltage.

2. The apparatus of claim 1, wherein the charge pump regulator circuit is further configured to, before the beginning of the time period, control the charge pump to increase the output voltage at the output node of the charge pump.

3. The apparatus of claim 1, wherein the charge pump regulator circuit further includes a resistor and a capacitor coupled in parallel to form a parallel RC circuit; and a comparator coupled to the parallel RC circuit.

4. The apparatus of claim 1, wherein the charge pump regulator circuit includes an edge detector circuit; and a timing circuit, and
   wherein the edge detector circuit is configured to provide an output signal to the timing circuit responsive to the detected change in the regulator output signal.

5. The apparatus of claim 1, wherein the charge pump regulator circuit includes a timing circuit configured to apply a new scaling factor by which an output voltage level of charge pump is reduced until the time period elapses.

6. The apparatus of claim 1, wherein the charge pump regulator circuit further includes a parallel RC circuit configured to control a voltage level of a feedback signal provided by the parallel RC circuit, and
   wherein the charge pump regulator circuit further includes an edge detector circuit configured to control the parallel RC circuit to reduce the voltage level of the feedback signal for the time period responsive to the detected change in the regulator output signal.

7. The apparatus of claim 1, wherein the charge pump regulator circuit further includes a parallel RC circuit configured to control a voltage level of a feedback signal for the time period based on the output voltage at the output node of the charge pump.

8. The apparatus of claim 1, wherein the charge pump regulator circuit further includes a parallel RC circuit; an edge detector circuit; and a comparator coupled between the parallel RC circuit and the edge detector circuit, and
   wherein the comparator is configured to provide the regulator output signal.

9. The apparatus of claim 1, wherein the charge pump regulator circuit further includes a comparator; a timing circuit; and an edge detector circuit coupled between the comparator and the timing circuit, and
   wherein the timing circuit is configured to determine a new scaling factor to apply to the output voltage of the charge pump for the time period to reduce a voltage level of a feedback signal input by the comparator.

10. The apparatus of claim 1, wherein the time period is determined based, at least in part, on a rate of voltage increase at the output node of the charge pump before the change in the regulator output signal is detected.

11. A method comprising:
    receiving an increasing output voltage of a charge pump configured to provide a target voltage level to a load circuit;
    comparing a feedback voltage based, at least in part, on the increasing output voltage and a resistor to a reference voltage; and
    when a level of the feedback voltage is determined to be equal to or greater than a level of the reference voltage, lowering the feedback voltage to a level less than a level of the reference voltage to cause the charge pump to continue increasing the output voltage.

12. The method of claim 11, wherein a node of the load circuit reaches the target voltage level during a time period subsequent to determining the level of the feedback voltage is equal to or greater than the level of the reference voltage.

13. The method of claim 11, further comprising:
activating a charge pump regulator circuit coupled to the charge pump until a time period subsequent to determining the level of the feedback voltage is equal to or greater than the level of the reference voltage elapses.

14. The method of claim 11, wherein the feedback voltage is maintained at the level less than the level of the reference voltage until a time period subsequent to determining the level of the feedback voltage is equal to or greater than the level of the reference voltage elapses.

15. The method of claim 11, wherein, when a time period subsequent to determining the level of the feedback voltage is equal to or greater than the level of the reference voltage elapses, the feedback voltage increases back to the level of the reference voltage.

16. The method of claim 11, further comprising:
changing a logical value of a regulator output signal when the feedback voltage is lowered to the level less than the level of the reference voltage.

17. A method comprising:
increasing an output voltage of a charge pump;
detecting a change in a regulator output signal based at least on a feedback signal from the charge pump, wherein the change indicates the output voltage of the charge pump reaches a target voltage level; and
responsive to detecting the change in the regulator output signal, controlling the charge pump to continue charging for a period of time by changing a voltage level of the feedback signal.

18. The method of claim 17, further comprising:
comparing a voltage level of a feedback signal and a voltage level of a reference signal, wherein the voltage level of the feedback signal is based, at least in part, on the output voltage of the charge pump; and
reducing the voltage level of the feedback signal so that the voltage level of the feedback signal is less than the voltage level of the reference signal until the period of time elapses.

19. The method of claim 17, further comprising:
raising a voltage of a reference signal until the voltage at the target node of a load circuit reaches the target voltage level,
wherein the charge pump remains activate during the period of time when the voltage of the reference signal is raised.

20. The method of claim 17, further comprising:
raising a voltage level of a reference signal for the period of time,
wherein the period of time is statically or dynamically determined.

21. The apparatus of claim 1, wherein the charge pump regulator circuit is configured to increase the reference voltage to cause the charge pump to continue charging during the time period.

* * * * *